(12) United States Patent
Lan et al.

(10) Patent No.: US 7,233,610 B2
(45) Date of Patent: Jun. 19, 2007

(54) NITRIDE BASED SEMICONDUCTOR LASER DIODE DEVICE WITH A BAR MASK

(75) Inventors: Wen-How Lan, Taoyuan County (TW); Yuh-Der Shiang, Taichung (TW); Jia-Ching Lin, Taipei County (TW); Ker-Jun Lin, Hsinchu County (TW); Kai-Fung Perng, Hsinchu County (TW); Ya-Tung Cherng, Taoyuan County (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 222 days.

(21) Appl. No.: 10/908,825

(22) Filed: May 27, 2005

(65) Prior Publication Data

US 2005/0199893 A1    Sep. 15, 2005

Related U.S. Application Data

(62) Division of application No. 10/250,200, filed on Jun. 12, 2003, now Pat. No. 7,126,972.

(30) Foreign Application Priority Data

Sep. 20, 2002    (TW) .............................. 91121531 A

(51) Int. Cl.
*H01S 5/00* (2006.01)
*H01S 3/20* (2006.01)

(52) U.S. Cl. .............................. 372/46.015; 372/43.01; 372/54

(58) Field of Classification Search .............. 372/43.01, 372/46.013, 46.015, 54
See application file for complete search history.

(56) References Cited

U.S. PATENT DOCUMENTS 6,711,197 B2 * 3/2004 Tojo et al. ................ 372/46.01
2004/0094773 A1 * 5/2004 Kiyoku et al. .............. 257/103

FOREIGN PATENT DOCUMENTS

JP          2002-094169        * 3/2002

* cited by examiner

*Primary Examiner*—Armando Rodriguez
(74) *Attorney, Agent, or Firm*—Jianq Chyun IP Office

(57)                ABSTRACT

A nitride based semiconductor laser diode device comprising a selective growth mask with a grating structure is proposed. The island-like stacked epitaxial layers including the P-type cladding layer is formed from the selective growth mask upon the active layer of the semiconductor laser structure. This proposed structure can reduce the strain by the deformation due to the isolate structure. Thus, increase of thickness of the cladding layer and/or increase of composition difference can be achieved without crack existing in the island-like stacked epitaxial layers. The optical confinement can be effectively improved.

4 Claims, 5 Drawing Sheets

NITRIDE BASED SEMICONDUCTOR LASER DIODE DEVICE WITH A BAR MASK

CROSS-REFERENCE TO RELATED APPLICATION

This application is a divisional of a prior application Ser. No. 10/250,200, filed Jun. 12, 2003, now U.S. Pat. No. 7,126,971 which claims the priority benefit of Taiwan application serial no. 91121531, filed on Sep. 20, 2002. All disclosure of the Taiwan application is incorporated herein by reference.

BACKGROUND OF THE INVENTION

1. Field of Invention

The present invention relates to a semiconductor device by gallium nitride compound. More particularly, the present invention relates to a structure capable of applying on a gallium nitride laser diode device for increasing a thickness of a surface epitaxial layer. In the specification, the surface epitaxial layer is referring to a patterned epitaxial layer in the gallium nitride laser diode device.

2. Description of Related Art

The typical optoelectronics device is a hetero structure. Since the crystal structure between the hetero epitaxial layers is not matched and the thermal expansion coefficients are also different, a strain energy exists at the interface. During the fabrication process or in operation of the device, this strain energy will be partially released by a form of dislocation or other defect forms. When the thickness of the epitaxial layer is greater than a certain critical value, the material then release the energy by a crack form, resulting in a crack of the epitaxial layer. For this consideration, the hetero epitaxial crystal layer cannot be grown in overlarge thickness. If the thickness of the epitaxial layer is too large, a poor function of the device or even a severe damage would occur due to the crack. However, if the thickness of the epitaxial layer is not sufficient large, a poor performance may also occur.

In the conventional technology, it has several methods can reduce the problems caused by the strain energy in the hetero structure. For example, (1) a method of epitaxial lateral overgrowth (ELOG) is proposed. In addition, (2) a buffer layer is also introduced, wherein an aluminum nitride layer or a gallium nitride layer in a rather small thickness is formed on a substrate at low temperature, to serve as a buffer layer, so as to reduce the problem of not being match for the crystal lattice between the epitaxial layer and the substrate. As a result, the condition for subsequently growing the gallium nitride at high temperature is improved and the quality of epitaxial crystal structure is also improved. In addition, (3) a strain layer superlattice is also proposed.

The conventional gallium nitride device in the current status is mostly using the C-plane of the sapphire ($Al_2O_3$) as the substrate. It has about an amount of 16% in lattice mismatch existing between the substrate and the gallium nitride epitaxial crystal, resulting in a rather large strain energy inside the gallium nitride thin film, which is grown on the sapphire, in which the density of the dislocation is high up to $10^9$–$10^{11}/cm^2$. The foregoing technology can only be used for solving the strain energy or effect, which are caused by epitaxial layer between substrate and the gallium nitride, or inside the device.

Taking the gallium nitride laser diode as an example, the application for the foregoing conventional technologies is basically limited to the epitaxial layer under the active layer. The epitaxial layer above the active layer still has the problem of hetero material structure. In other words, the conventional method still cannot effectively solve the problem of crack in the epitaxial layer above the active layer.

FIG. 1 is a cross-sectional view, schematically illustrating the structure of a conventional gallium nitride laser diode, which is sequentially formed with a substrate 101, a buffer layer 102 with gallium nitride compound semiconductor formed at relative low temperature, an N-type gallium nitride compound semiconductor layer 103, a set of bar mask 104, an N-type gallium nitride compound semiconductor layer 105, a heavily doped layer 106, an N-type gallium nitride compound semiconductor superlattice cladding layer 107, an N-type gallium nitride compound semiconductor light guiding layer 108, a gallium nitride compound semiconductor active layer 109, a P-type gallium nitride compound semiconductor cap layer 110, a P-type gallium nitride compound semiconductor light guiding layer 111, a P-type gallium nitride compound semiconductor superlattice cladding layer 112, and a P-type metal electrode contact layer 113. In order to improve the quality of the epitaxial crystal and prevent the crack from occurring, the conventional structure for the gallium nitride laser diode structure has included the low-temperature buffer layer 102, the method of ELOG (104), the strain layer super lattice structure (107, 112). However, these kinds of technologies for reducing the strain and the defects is not effective with respect to strain energy existing in the surface hetero epitaxial layer. FIG. 2, is a picture, schematically illustrating the crack occurring on the surface of the epitaxial layer for the conventional gallium nitride laser diode structure.

On the gallium nitride laser diode structure, the cladding layer is usually formed from $Al_xGa_{1-x}N$, where if the quantity of X is higher, then the refraction index is smaller, the energy gap is larger, and the light confinement is better. As a result, the lattice mismatch is larger, thus, the thickness can not be overlarge. If the $Al_xGa_{1-x}N$ layer is too thick, the crack is then easily occurring, and causes a failure of device. However, if the cladding layer is not sufficiently thick, the effect of light confinement then is getting worse, and the performance of device is then poor. Thus, it is a difficult issue for fabrication that how to control the thickness of epitaxial layer and the composition, so as to reduce the cracking of the epitaxial layer and improve the performance of the device.

SUMMARY OF THE INVENTION

The invention provides an epitaxial growing structure, which uses a specific mechanism for the surface, so as to increase the thickness of the epitaxial layer in the gallium nitride laser diode structure but reduce the occurrence of crack.

As embodied and broadly described herein, the invention provides a laser diode structure with an epitaxial crystal growing structure, which comprises a P-type gallium nitride compound semiconductor light guiding layer, formed on a surface of the active layer. A set of bar mask substance is formed on the P-type gallium nitride compound semiconductor light guiding layer. An island-like stacked structure is formed on the P-type gallium nitride compound semiconductor light guiding layer and the set of bar mask substance. The island-like stacked structure is formed including a P-type gallium nitride compound semiconductor cladding layer and a P-type metal electrode contact layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Several terms used in the specification of the invention are generally described as follows. The term of gallium nitride compound semiconductor (GNCS) is referring to a form of $Al_xIn_yGa_{(1-x-y)}N$ ($0 \leq x \leq 1$, $0 \leq y \leq 1$, $0 \leq x+y \leq 1$), which can be formed by, for example, metal organic chemical vapor deposition (MOCVD) or molecular beam epitaxial (MBE) crystal growth, or other similar epitaxial crystal growth. The dopants doped in the N-type gallium nitride compound semiconductor of the invention include Si, Ge, or other like elements with the same function. The dopants doped in the P-type gallium nitride compound semiconductor of the invention include Mg, Zn, Be, or other like elements with the same function.

Embodiment 1

Figure 1:
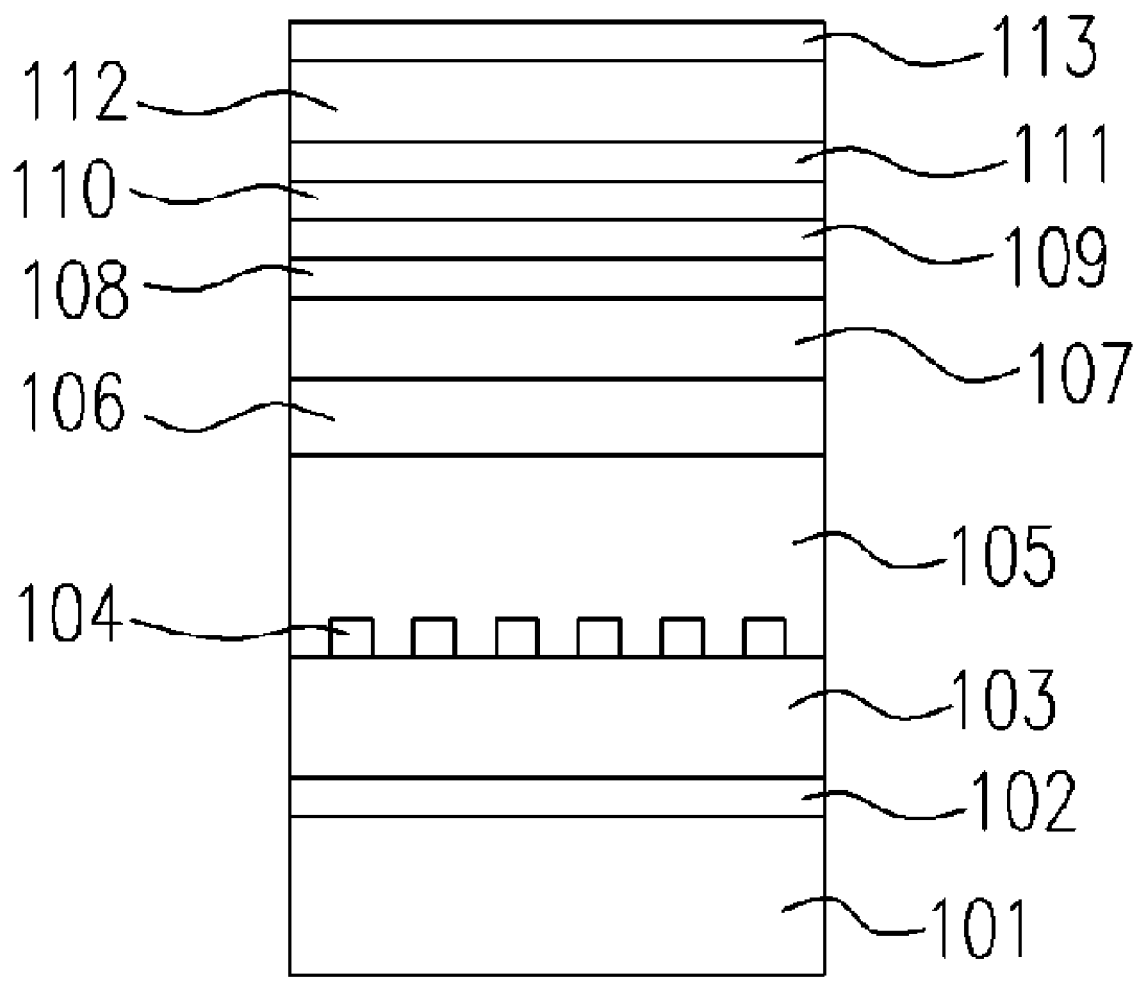
FIG. 1 is a cross-sectional view, schematically illustrating the structure of a conventional gallium nitride laser diode.
Figure 2:
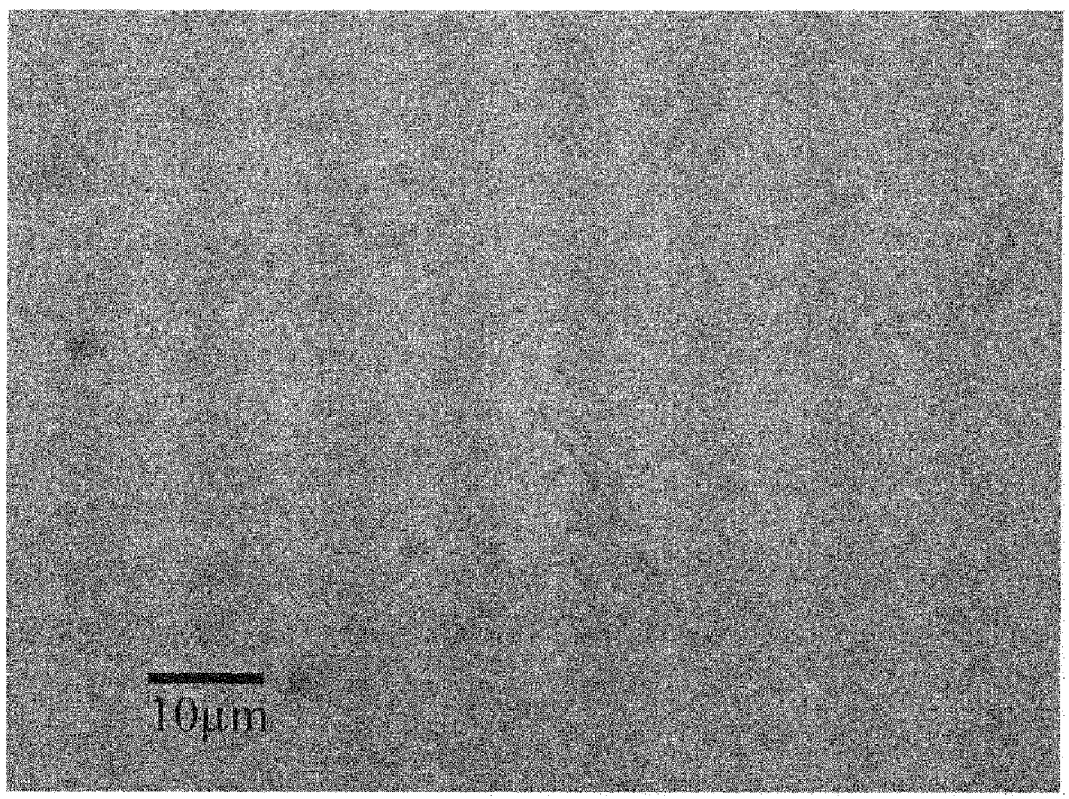
FIG. 2 is a picture, schematically illustrating the crack occurring on the surface of the epitaxial layer for the conventional gallium nitride laser diode structure.
Figure 3:
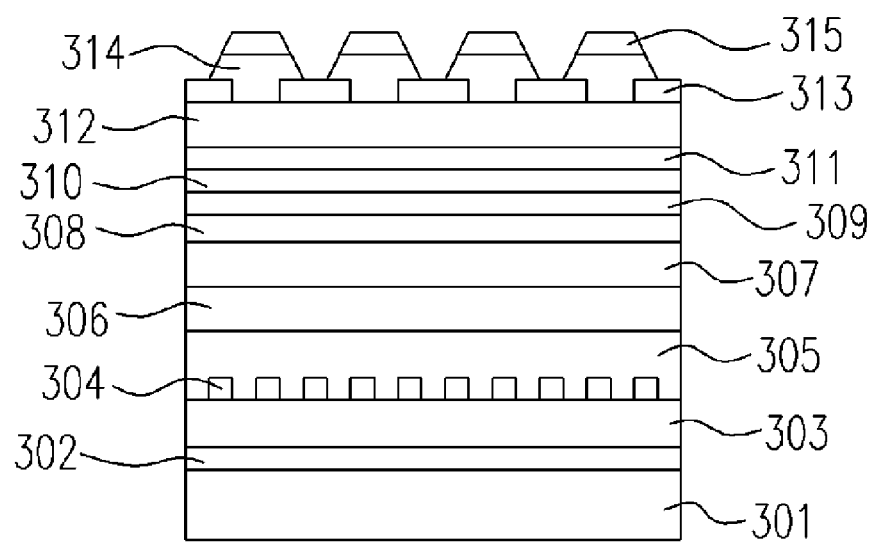
FIG. 3 is a cross-sectional view, schematically illustrating the structure of a gallium nitride laser diode, according to the first preferred embodiment of this invention.

FIG. 3 is a cross-sectional view, schematically illustrating the structure of a gallium nitride laser diode, according to the first preferred embodiment of this invention. A substrate 301 is provided. The substrate 301 includes, for example, sapphire ($Al_2O_3$), silicon carbide (SiC), gallium nitride (GaN), Spinel ($MgAl_2O_4$), gallium arsenide (GaAs), zinc oxide (ZnO), silicon (Si), and so on. A gallium nitride compound semiconductor buffer layer 302 is formed on substrate 301 with an amorphous and/or polycrystallized structure and a thickness of 50–500 Angstrom. An N-type GNCS 303 is formed on the buffer layer 302 with a thickness of about 3–7 microns.

After the crystal growth, the whole structure is shifted out from the crystal growing machine, and the coating, photolithography and etching processes are performed to form a lower bar mask substance 304 on the N-type GNCS layer 303. The direction of the bar can be any direction. The thickness can be, for example, 100–2000 Angstroms and the width can be, for example, 2–20 microns. The distance between the parallel bars in the bar mask substance 304 is about 2–500 microns. The bar mask substance 304 is used to cause multiple local crystal growing regions during the regrowth on the epitaxial layer, so as to change the distribution of strain force in the epitaxial layer and the growing direction of dislocation. As a result, the epitaxial layer formed over the N-type GNCS layer 303 has less dislocation density and strain energy. The bar mask substance 304 by itself has to have sufficient stability without producing the chemical reaction with the peripheral epitaxial materials, or contaminating the peripheral epitaxial materials. In addition, during the process of epitaxial growing, the epitaxy of GNCS does not directly grow on the mask substance. Each bar of the lower bar mask substance 304 has a cross-sectional shape in rectangular or any shape with similar functions. The mask substance 304 preferably includes silicon oxide, silicon nitride, or other material with similar function.

Then, the substrate 301 is transferred back to the epitaxial growing machine. An N-type GNCS layer 305 is formed on the surface of the N-type GNCS layer 303 and the lower bar mask substance 304. The N-type GNCS layer 305 is grown to have a planar surface and a thickness of 3–20 microns. A heavily doped N-type GNCS layer 306 is formed on the N-type GNCS layer 305 with a thickness of, for example, between 500 Angstroms and 2 microns. An N-type GNCS cladding layer 307 is formed on the heavily doped N-type GNCS layer 306. The N-type GNCS cladding layer 307 is a multi-layer structure, including a super lattice structure composed of N-type gallium nitride semiconductor layer/ N-type aluminum gallium nitride semiconductor layer with a thickness of 35–200/35–200 Angstroms. Moreover, the pair number is about 3 to 100 pairs. As a result, the total thickness is about 210–40000 Angstroms. An N-type GNCS light guiding layer 308 is formed on the N-type GNCS cladding layer 307 with a thickness of about 100–2000 Angstroms. Even though this layer can be doped with N-type dopants, it can also be non-doped. A GNCS active layer 309 is formed on the GNCS light guiding layer 308 with a single-layer structure or a multi-layer structure by a thickness of about 30–1000 Angstroms. A P-type GNCS light guiding layer 310 is formed on the GNCS active layer 309 by a thickness of about 100–2000 Angstroms. Even though this layer can be doped with P-type dopants, it can also be non-doped. A P-type GNCS cap layer 311 is formed on the GNCS light guiding layer 310 by a thickness of about 300–2000 Angstroms. A P-type GNCS light guiding layer 312 is formed on the GNCS cap layer 311 by a thickness of about 200–3000 Angstroms.

Further still, the whole structure is transferred out from the epitaxial growing machine. The coating, photolithography, and etching processes are performed to form an upper bar mask substance 313 on the P-type GNCS light guiding layer 312. The direction of the bars should be the same as the direction of the lower bar mask substance 304. The thickness of the bars is about 100–2000 Angstroms and the width is about 50–500 microns. The distance between the parallel bars is about 1–10 microns. Similar to the lower bar mask substance 304, the upper bar mask substance 313 by itself should have sufficient stability without producing the chemical reaction with the peripheral epitaxial materials, or contaminating the peripheral epitaxial materials. In addition, during the process of epitaxial growing, the epitaxy of GNCS does not directly grow on the mask substance. Each bar of the upper bar mask substance 313 has a cross-sectional shape in rectangular or any shape with similar functions. The mask substance 313 preferably includes silicon oxide, silicon nitride, or other material with similar function.

Figure 4:
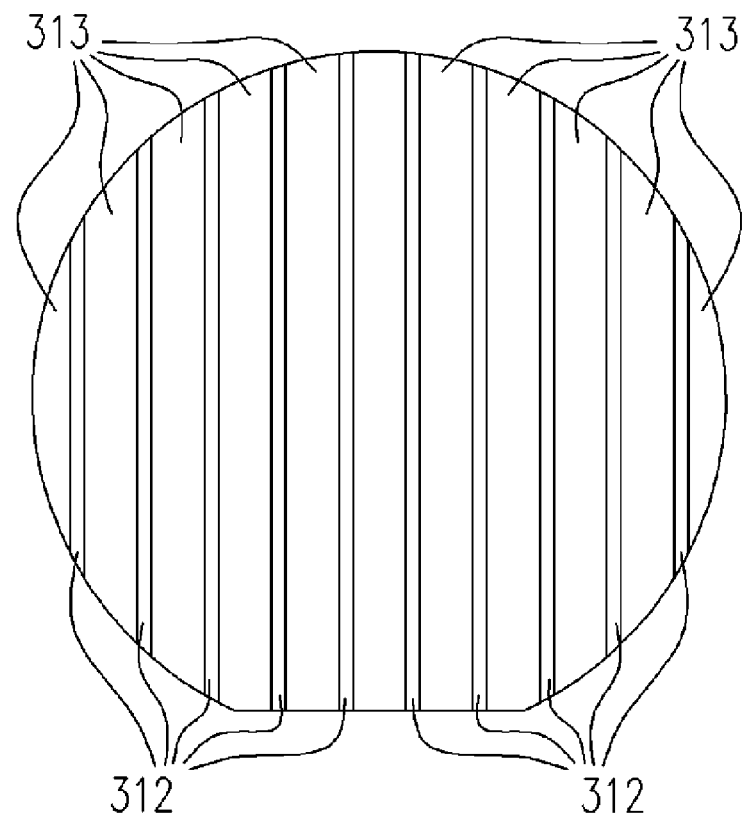
FIG. 4 is a top view, schematically illustrating the structure of the bar mask substance 313 over the epitaxial layer, according to the first preferred embodiment of this invention.

FIG. 4 is a top view, schematically illustrating the structure of the bar mask substance 313 over the epitaxial layer. The upper bar mask substance 313 is used to form the island-like stacked structure on the surface of the gallium nitride laser diode. Thereby, the absorption of the elastic strain from the material can release the strain energy inside the epitaxial crystal. As a result, the epitaxial layer over the bar mask substance 313 can be grown by a larger thickness without crack. This is one of the advantages of the invention. Further descriptions are as follows.

The whole structure is then transferred back to the epitaxial growing machine. A P-type GNCS cladding layer 314 is formed on the P-type GNCS light guiding layer 312 and the upper bar mask substance 313. Since the upper bar mask substance 313 produces a crystal growing selective effect, the P-type GNCS cladding layer 314 is grown as island-like stacked structure. In order to allow the elastic strain to be effective, the islands to each other should be separated without connection. The P-type GNCS cladding layer 314 can be a single layer of aluminum gallium nitride semiconductor or a composed layer of P-type gallium nitride semiconductor/P-type aluminum gallium nitride semiconductor with the super lattice structure. The total thickness is about 0.5–10 microns. A P-type metal electrode contact layer 315 is formed on P-type GNCS cladding layer 314 by a thickness of about 150–2000 Angstroms.

Embodiment 2

Figure 5:
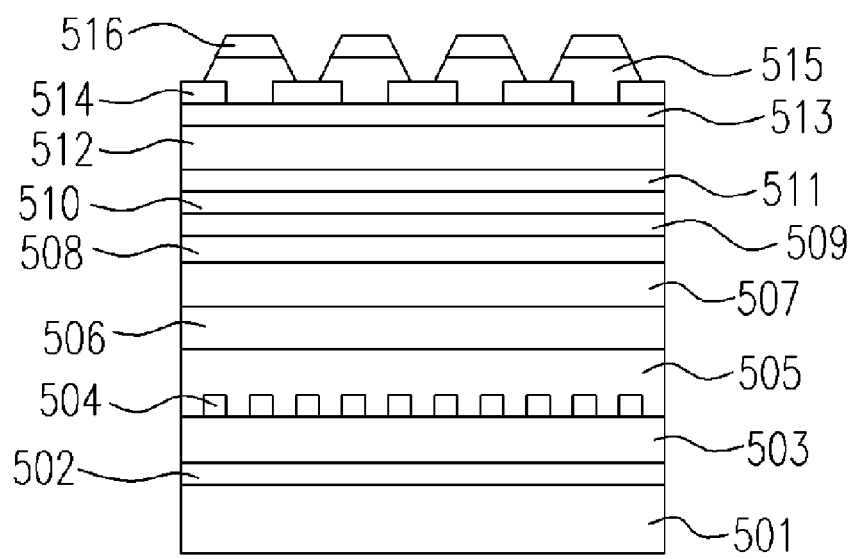
FIG. 5 is a cross-sectional view, schematically illustrating the structure of a gallium nitride laser diode, according to the second preferred embodiment of this invention.

FIG. 5 is a cross-sectional view, schematically illustrating the structure of a gallium nitride laser diode, which includes a substrate 501 having the materials including aluminum oxide, silicon carbide, gallium nitride, Spinel, gallium arsenide, zinc oxide, silicon, and so on. A GNCS buffer layer 502 is formed on the substrate 501 as an amorphous and/or polycrystallized structure by a thickness of 50–500 Angstroms. An N-type GNCS layer 503 is formed on the GNCS buffer layer 502 by a thickness of about 3–7 microns.

After the crystal growth, the whole structure is shifted out from the crystal growing machine, and the coating, photolithography and etching processes are performed to form a lower bar mask substance 504 on the N-type GNCS layer 503. The features of the lower bar mask substance 504 is similar to the lower bar mask substance 304 in Embodiment 1. Each bar of the lower bar mask substance 504 has a cross-sectional shape in rectangular or any shape with similar functions. The direction of the bar can be any direction. The thickness can be, for example, 100–2000 Angstroms and the width can be, for example, 2–20 microns. The distance between the parallel bars in the bar mask substance 504 is about 2–500 microns. The material includes, for example, silicon oxide, silicon nitride, or other material with similar function.

Then, whole structure is transferred back to the epitaxial growing machine. An N-type GNCS layer 505 is formed on the surface of the N-type GNCS layer 503 and the lower bar mask substance 504. The N-type GNCS layer 505 is grown to have a planar surface and a thickness of 3–20 microns. A heavily doped N-type GNCS layer 506 is formed on the N-type GNCS layer 505 with a thickness of, for example, between 500 Angstroms and 2 microns. An N-type GNCS cladding layer 507 is formed on the heavily doped N-type GNCS layer 506. The N-type GNCS cladding layer 507 is a multi-layer structure, including a super lattice structure composed of N-type gallium nitride semiconductor layer/N-type aluminum gallium nitride semiconductor layer with a thickness of 35–200/35–200 Angstroms. Moreover, the pair number is about 3 to 100 pairs. As a result, the total thickness is about 210–40000 Angstroms. An N-type GNCS light guiding layer 508 is formed on the N-type GNCS cladding layer 507 with a thickness of about 100–2000 Angstroms. Even though this layer can be doped with N-type dopants, it can also be non-doped. A GNCS active layer 509 is formed on the GNCS light guiding layer 508 with a single-layer structure or a multi-layer structure by a thickness of about 30–1000 Angstroms. A P-type GNCS light guiding layer 510 is formed on the GNCS active layer 509 by a thickness of about 100–2000 Angstroms. Even though this layer can be doped with P-type dopants, it can also be non-doped. A P-type GNCS cap layer 511 is formed on the GNCS light guiding layer 510 by a thickness of about 300–2000 Angstroms. A P-type GNCS light guiding layer 512 is formed on the GNCS cap layer 511 by a thickness of about 200–3000 Angstroms. A P-type GNCS cladding layer 513 is formed on the P-type GNCS light guiding layer 512. The P-type GNCS cladding layer 513 is a multi-layer structure composed of P-type gallium nitride semiconductor layer/P-type aluminum gallium nitride semiconductor layer by thickness of 35–200/35–200 Angstroms, and the pair number is about 3 to 10, resulting in a total thickness of about 210–4000 Angstroms.

Then, the whole structure is transferred out from the epitaxial growing machine. The coating, photolithography, and etching processes are performed to form an upper bar mask substance 514 on the P-type GNCS cladding layer 513. The features of the bars in the upper bar mask substance 514 are similar to those in the bar mask substance 313 in Embodiment 1 with the cross-sectional shape in rectangular or any shape with similar functions. The direction of the bars should be the same as the direction of the lower bar mask substance 504. The thickness of the bars is about 100–2000 Angstroms and the width is about 50–500 microns. The distance between the parallel bars is about 1–10 microns.

The whole structure is transferred back to the epitaxial growing machine. A P-type GNCS cladding layer 515 is formed on the P-type GNCS cladding layer 513 and the upper bar mask substance 514. Since the upper bar mask substance 514 produces a crystal growing selective effect, the P-type GNCS cladding layer 515 is grown as island-like stacked structure. The islands to each other should be separated independently without connection, so as to have the elastic strain effect. The P-type GNCS cladding layer 515 can be a single layer of aluminum gallium nitride semiconductor or a composed layer of P-type gallium nitride semiconductor/P-type aluminum gallium nitride semiconductor with the super lattice structure. The total thickness is about 0.5–10 microns. A P-type metal electrode contact layer 516 is formed on P-type GNCS cladding layer 515 by a thickness of about 150–2000 Angstroms.

Embodiment 3

Figure 6:
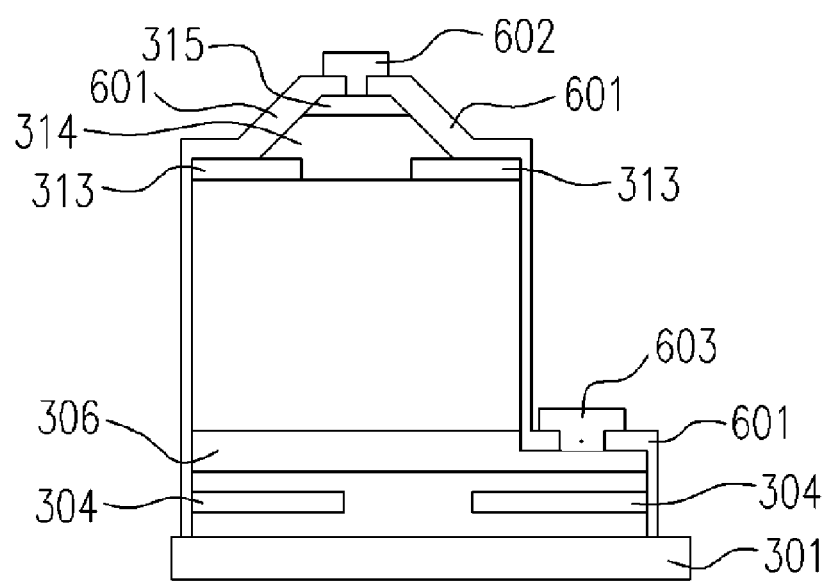
FIG. 6 is a cross-sectional view, schematically illustrating the structure of a gallium nitride laser diode, according to the third preferred embodiment of this invention.

FIG. 6 is a cross-sectional view, schematically illustrating the structure of a gallium nitride laser diode, according to the third preferred embodiment of this invention. The structure is formed by photolithography, etching, and coating processes on the structure of gallium nitride laser diode (see FIG. 3) in Embodiment 1. In addition to the gallium nitride laser diode in epitaxial structure, the structure further includes an insulating layer 601 from, for example, silicon oxide. A P-type metal electrode 602 is formed on the P-type metal electrode contact layer 315. An N-type electrode 603 is formed on the heavily doped N-type GNCS layer 306.

Embodiment 4

Figure 7:
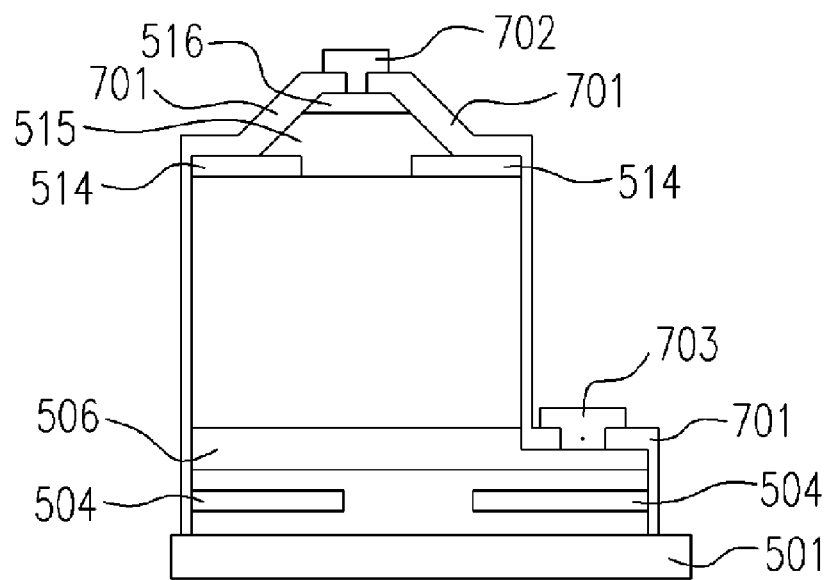
FIG. 7 is a cross-sectional view, schematically illustrating the structure of a gallium nitride laser diode, according to the fourth preferred embodiment of this invention.

FIG. 7 is a cross-sectional view, schematically illustrating the structure of a gallium nitride laser diode, according to the fourth preferred embodiment of this invention. The structure is formed by photolithography, etching, and coating processes on the structure of gallium nitride laser diode (see FIG. 5) in Embodiment 2. In addition to the gallium nitride laser diode in epitaxial structure, the structure further includes an insulating layer 701 from, for example, silicon oxide. A P-type metal electrode 702 is formed on the P-type metal electrode contact layer 516. An N-type electrode 703 is formed on the heavily doped N-type GNCS layer 506.

Figure 8:
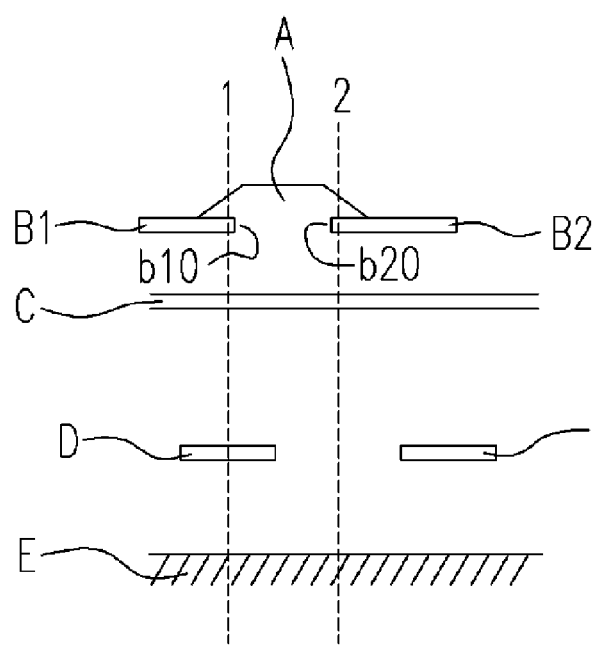
FIG. 8 is a cross-sectional view, schematically illustrating the relative position for the lower bar mask substance, the upper bar mask substance, the active layer, and the island-like stacked structure, according to the preferred embodiment of this invention.

If the lower bar mask substance 304, 504 are properly associating with the upper bar mask substance 313, 514, then the gallium nitride laser diode can have better efficiency. FIG. 8 is a cross-sectional view, schematically illustrating the relative position for the lower bar mask substance, the upper bar mask substance, the active layer, and the island-like stacked structure, according to the preferred embodiment of this invention. In FIG. 8, "A" represents the island-like stacked structure. B1 represents the upper bar mask substance at a left side of the island-like stacked structure A. B2 represents the upper bar mask substance at a right side of the island-like stacked structure A. C represents the active layer. D represents the lower bar mask substance. E represents the substrate. The dashed line 1 represents the center line of the short side of the lower bar mask substance. The dashed line 2 represents the center line of the window region between the bars of the lower bar mask substance. "b10" represents a side of the upper bar mask substance B1 close to the island-like stacked structure A. "b20" represents a side of the upper bar mask substance B1 close to the island-like stacked structure A. The relative locations for the gallium nitride laser diode structure are described as follows.

1. The upper bar mask substance B1, B2 are located between the island-like stacked structure A and the active layer C.

2. The lower bar mask substance D is located between the substrate E and the active layer C.

3. The side b10 of the upper bar mask substance B1 has to cross over the center line 1 (dashed line 1) of the short side of the lower bar mask substance D.

4. The side b20 of the upper bar mask substance B2 has to cross over the center line 2 (dashed line 2) of the window region between the bars of the lower bar mask substance.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A gallium nitride laser diode, comprising:
a substrate; and
a multi-layer structure for the gallium nitride laser diode, further including a lower bar mask substance, an N-type gallium nitride compound semiconductor (GNCS) cladding layer, an active layer, an upper bar mask substance, and a P-type gallium nitride compound semiconductor cladding layer, sequentially formed over the substrate.

2. The gallium nitride laser diode of claim 1, wherein the upper bar mask substance is located over the active layer.

3. The gallium nitride laser diode of claim 1, wherein bars of the upper bar mask substance are parallel and have a desired direction, wherein the bars have a thickness of about 100–2000 Angstroms and a width of 50–500 microns, and a distance between the parallel bars is about 1–10 microns.

4. The gallium nitride laser diode of claim 1, wherein directions the upper bar mask substance and the lower mask substance are parallel to each other.

* * * * *